United States Patent
Kimura

[11] Patent Number: 6,084,232
[45] Date of Patent: *Jul. 4, 2000

[54] OPTICAL RECEIVER PRE-AMPLIFIER WHICH PREVENTS RINGING BY SHUNTING AN INPUT CURRENT OF THE PRE-AMPLIFIER

[75] Inventor: Hiroshi Kimura, Hyogo, Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/084,946

[22] Filed: May 28, 1998

[30] Foreign Application Priority Data

Nov. 13, 1997 [JP] Japan ................................. 9-311751

[51] Int. Cl.$^7$ ............................... H01J 40/14; H03F 1/36
[52] U.S. Cl. ...................... 250/214 A; 330/110; 330/308
[58] Field of Search ........................ 250/214 A, 214 AG, 250/214 R, 214 LA; 330/59, 110, 308; 359/189, 194

[56] References Cited

U.S. PATENT DOCUMENTS

| | | | |
|---|---|---|---|
| 4,623,786 | 11/1986 | Rodwell .............................. | 250/214 A |
| 4,902,982 | 2/1990 | Moore et al. . | |
| 5,532,471 | 7/1996 | Khorramabadi et al. ........... | 250/214 A |
| 5,539,779 | 7/1996 | Nagahori . | |
| 5,636,048 | 6/1997 | Kogure et al. . | |
| 5,786,730 | 7/1998 | Hadley .............................. | 250/214 AG |

FOREIGN PATENT DOCUMENTS

| | | |
|---|---|---|
| 62-281480 | 12/1987 | Japan . |
| 62-285537 | 12/1987 | Japan . |
| 3-60208 | 3/1991 | Japan . |
| 6-140843 | 5/1994 | Japan . |
| 10-126167 | 5/1998 | Japan . |
| 10-270952 | 10/1998 | Japan . |

OTHER PUBLICATIONS

D. Yamazaki et al., "A Wide Dynamic Range Preamplfiier IC", 1996 IEICE Grand Conference, p. 675 and partial English translation thereof.

*Primary Examiner*—Seungsook Ham
*Assistant Examiner*—Kevin Pyo
*Attorney, Agent, or Firm*—McDermott, Will & Emery

[57] ABSTRACT

An inverting amplification circuit and a feedback resistor are connected in parallel with each other between an input terminal and an output terminal, so that an input current flowing from a photodiode can be converted into an output voltage. Furthermore, a shunt transistor is disposed with its source connected with the input terminal, its gate connected with the output terminal and its drain connected with a ground power supply. When the input current is large, a current flowing into the feedback resistor is decreased, so that a part of the input current can be shunted by the shunt transistor in accordance with a voltage difference between the input terminal and the output terminal. Thus, the output voltage waveform can be free from ringing.

9 Claims, 10 Drawing Sheets

OPTICAL RECEIVER PRE-AMPLIFIER WHICH PREVENTS RINGING BY SHUNTING AN INPUT CURRENT OF THE PRE-AMPLIFIER

BACKGROUND OF THE INVENTION

The present invention relates to a pre-amplifier for use in an optical receiver.

In recent years, a PON (passive optical network) system such as a PDS (passive double star) optical subscriber system in Japan has been variously examined for the purpose of realization of a future FTTH (fiber to the home) system. It is, however, economically difficult to introduce optical fibers into general public home as compared with the existing metallic subscriber network. Under such circumstances, an optical subscriber network, in which each of plural optical fibers connected with a base station is branched into plural optical fibers through a star coupler, is regarded to be a promising system. In this network, one subscriber is connected with each of the branched optical fibers. The subscribers thus share equipment of the base station, so that a bidirectional digital communication service can be inexpensively provided to the respective subscribers.

An optical receiver installed at home of each subscriber includes a photodiode for generating a current signal in accordance with an optical signal supplied through the optical fiber, a pre-amplifier for converting the current signal into a voltage signal, and an AGC (automatic gain control) circuit for converting the voltage signal into a voltage signal with a predetermined amplitude. A clock signal is recovered from the output of this AGC circuit, so that digital data can be reproduced in synchronization with the clock signal.

As a conventional pre-amplifier for use in an optical receiver, an amplifier including a feedback resistor interposed between input and output terminals of an inverting amplification circuit is known. When a gain of the inverting amplification circuit and a resistance value of the feedback resistor are indicated as $A(s)$ and $Rf$, respectively, and an input current and an output voltage of the pre-amplifier are indicated as $Iin(s)$ and $Vout(s)$, respectively, a transfer function $T(s)$ of the pre-amplifier is represented as follows:

$$T(s)=Vout(s)/Iin(s)=-A(s)/\{sCin+\{1+A(s)\}/Rf\} \quad (1)$$

wherein s indicates a complex angular frequency, and Cin indicates an input capacitance, which corresponds to a sum of all stray capacitances parasitic on the input terminal of the inverting amplification circuit. When an open loop gain and a corner angular frequency of the inverting amplification circuit are indicated as $Ao$ and $\omega h$, the gain $A(s)$ is linearly approximated as follows:

$$A(s)=Ao/(1+s/\omega h) \quad (2)$$

Accordingly, the following relationships hold:

$$T(s)=To/\{1+2\zeta s/\omega n+s^2/\omega n^2\} \quad (3)$$

$$\omega c=(1+Ao)/(Cin\,Rf) \quad (4)$$

$$To=-Ao\,Rf/(1+Ao) \quad (5)$$

$$\omega n=(\omega h \omega c)^{1/2} \quad (6)$$

$$\zeta=(1+Cin\,Rf\omega h)\omega n/\{2(1+Ao)\omega h\}$$

$$=(1+Cin\,Rf\,\omega h)\{4Cin\,Rf\,(1+Ao)\omega h\}^{-\frac{1}{2}} \quad (7)$$

wherein $\zeta$ is a constant designated as an attenuation coefficient.

The formula (3) reveals that the transfer function $T(s)$ is a reciprocal of a quadratic function of the complex angular frequency. Therefore, when the attenuation coefficient $\zeta$ is small, peaking can appear in the frequency characteristic of the pre-amplifier, which can sometimes cause oscillation.

A distance between the base station and the home of a subscriber, namely, the length of the optical fiber, varies depending upon the subscriber. Accordingly, in some cases, a subscriber P is provided with an optical signal with large strength but another subscriber Q is provided with merely a weak signal due to the attenuation of light in the optical fiber. As a countermeasure, the optical receiver of the subscriber P can be provided with an optical attenuator. However, when optical receivers having the same circuit configuration are to be installed in the home of all the subscribers for low cost system, the pre-amplifier is required to have a wide dynamic range characteristic so as to be able to deal with a wide range of currents from a minor current to a large current.

On the other hand, in order to improve the sensitivity of the optical receiver, it is necessary to decrease the influence of a thermal noise derived from the feedback resistor of the pre-amplifier. The equivalent input thermal noise $<IRf^2>$ derived from the feedback resistor is represented as follows:

$$<IRf^2>=4kTB/Rf \quad (8)$$

wherein k indicates the Boltzmann's constant, T indicates an absolute temperature and B indicates a frequency band. As is understood from the formula (8), the resistance value $Rf$ of the feedback resistor is necessary to be increased in order to improve the receiving sensitivity by decreasing the influence of the thermal noise. However, in the case where the feedback resistance value $Rf$ is increased, when the input current is large, the amplitude of the output voltage becomes so large and saturated that the waveform of the output voltage can be largely distorted. In other words, it is difficult to attain the wide dynamic range characteristic. In this manner, there is a trade-off relationship between the high sensitivity and the wide dynamic range characteristic, and hence, it is difficult to simultaneously attain the both advantages.

As a countermeasure for realizing both the high sensitivity and the wide dynamic range characteristic, Japanese Laid-Open Patent Publication No. 3-60208 discloses a pre-amplifier in which a diode is connected in parallel with a feedback resistor. In this pre-amplifier, when a voltage applied between the ends of the feedback resistor is increased because the input current is increased, the diode connected in parallel with the feedback resistor is turned on, so that a part of the current can be bypassed into the diode and that an effective feedback resistance value $Rf$ can be decreased. As a result, excessive increase of the output voltage amplitude can be avoided.

In this pre-amplifier, however, turbulence of the output voltage waveform such as ringing can be disadvantageously easily caused. Specifically, when the diode is turned on in response to the increase of the input current, the effective feedback resistance value $Rf$ is decreased so as to decrease the attenuation coefficient $\zeta$ (See the formula (7)). Accordingly, the peaking appears in the frequency characteristic of the pre-amplifier, resulting in making the operation of the pre-amplifier unstable.

SUMMARY OF THE INVENTION

The object of the present invention is providing a pre-amplifier for use in an optical receiver having a high sensitivity and a wide dynamic range which can suppress the occurrence of ringing.

In order to achieve this object, according to the invention, when the input current of the pre-amplifier is increased, a current flowing to a feedback resistor is decreased without changing a feedback resistance value, namely, without changing the frequency characteristic of the pre-amplifier. Specifically, the pre-amplifier of this invention for use in an optical receiver for converting an input current, supplied by a light receiving device so as to swing between a base current corresponding to a light-off level and a peak current corresponding to a light-on level, into an output voltage swinging between a base voltage corresponding to the base current and a peak voltage corresponding to the peak current, includes an input terminal for inputting the input current; an output terminal for outputting the output voltage; an inverting amplification circuit connected between the input terminal and the output terminal; a feedback resistor connected between the input terminal and the output terminal so as to allow the input current to flow; and a shunt transistor connected with the input terminal at its source, with the output terminal at its gate and with a power supply at its drain, so as to shunt a part of the input current in accordance with a voltage difference between the input terminal and the output terminal when the input current is large.

In case of a pre-amplifier accompanied by a differential input type AGC circuit in a next stage, the pre-amplifier of this invention further includes a circuit for generating an average voltage of the base voltage and a corrected peak voltage obtained by correcting the peak voltage by using an offset voltage in proportion with a current shunted by the shunt transistor; and a reference terminal for outputting the generated average voltage as a reference voltage for the output voltage.

According to this invention, when the input current is small, the shunt transistor is in an off-state. Thus, the voltage difference between the input terminal and the output terminal, namely, the gate-source voltage of the shunt transistor, increases in proportion to the input current. When the current input to the pre-amplifier is so large that the voltage difference exceeds the threshold voltage of the shunt transistor, the shunt transistor is turned on. As a result, a part of the input current is shunted by the shunt transistor, thereby decreasing a current flowing to the feedback resistor as compared with the case where the shunt transistor is not disposed. Accordingly, even when the resistance value of the feedback resistor is set at a large value in order to realize the high sensitivity, the wide dynamic range characteristic can be attained while suppressing the occurrence of ringing.

DETAILED DESCRIPTION OF THE INVENTION

Figure 1:
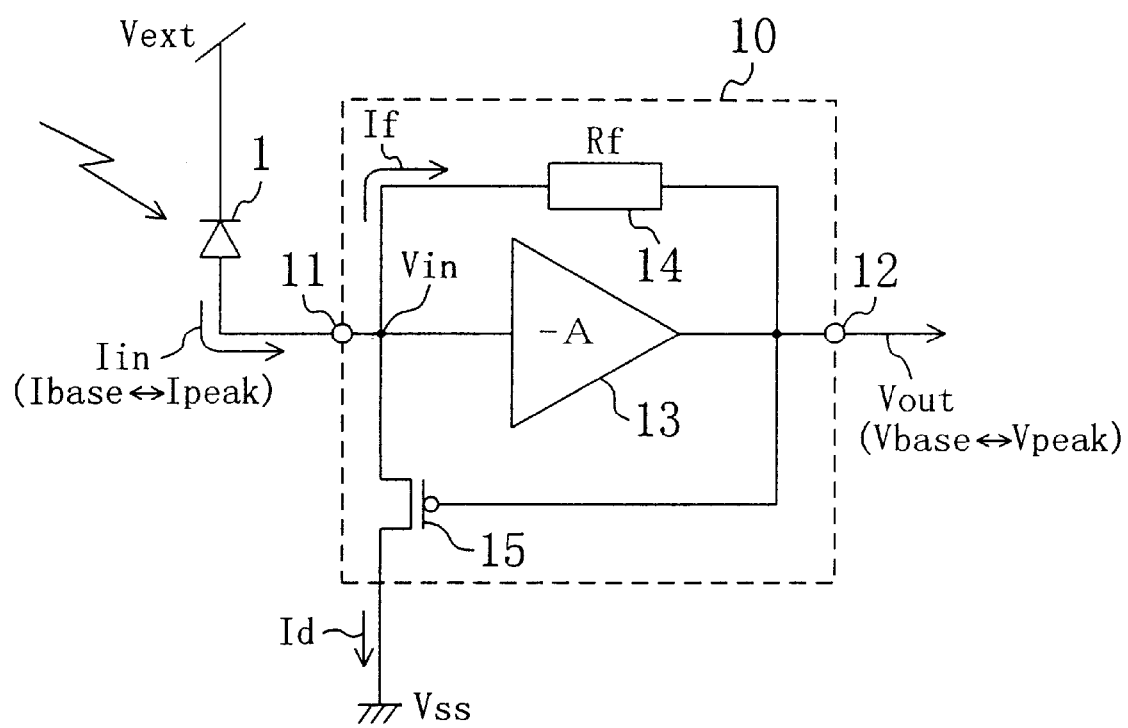
FIG. 1 is an electric circuit diagram for showing an exemplified configuration of a pre-amplifier for use in an optical receiver according to the invention.

FIG. 1 shows an exemplified configuration of a pre-amplifier according to the invention. In FIG. 1, a reference numeral 1 denotes a photodiode and a reference numeral 10 denotes the pre-amplifier. The pre-amplifier 10 converts an input current Iin supplied by the photodiode 1 so as to swing between a base current Ibase and a peak current Ipeak into an output voltage Vout swinging between a base voltage Vbase corresponding to the base current Ibase and a peak voltage Vpeak corresponding to the peak current Ipeak. The pre-amplifier 10 includes an input terminal 11 for inputting the input current Iin, an output terminal 12 for outputting the output voltage Vout, an inverting amplification circuit 13 and a feedback resistor 14 connected in parallel with each other between the input terminal 11 and the output terminal 12, and a shunt transistor 15 connected between the input terminal 11 and a ground power supply Vss. The photodiode 1 is a light receiving device for generating a current signal in accordance with an optical signal transferred through an optical fiber, and is disposed so that the input current Iin can flow into the input terminal 11 from an external power supply Vext. The inverting amplification circuit 13 has a gain A and is connected with a positive power supply Vdd and a ground power supply Vss not shown. The feedback resistor 14 has a resistance value Rf. In the configuration shown in FIG. 1, a PMOS (p-channel type metal oxide semiconductor) transistor is used as the shunt transistor 15. The source of the PMOS transistor 15 is connected with the input terminal 11, the gate thereof is connected with the output terminal 12 and the drain thereof is connected with the ground power supply Vss.

Herein, a voltage of the input terminal 11 is indicated as Vin. Since the input terminal 11 and the output terminal 12 are connected with each other through the feedback resistor 14, when Iin=Ibase=0, Vin=Vout=Vbase. At this point, the PMOS transistor 15 is in an off-state. The photodiode 1 allows the input current Iin with a given amplitude to flow into the input terminal 11. Accordingly, the output voltage Vout swings to be lower than the base voltage Vbase. In other words, the output voltage Vout swings between the base voltage (maximum voltage) Vbase and the peak voltage (minimum voltage) Vpeak. This peak voltage Vpeak decreases in proportion to the peak current Ipeak. On the other hand, the voltage Vin remains to be substantially constant to be equal to the base voltage Vbase because the gain A of the inverting amplification circuit 13 is very large. Accordingly, a voltage difference Vin−Vout between the input terminal 11 and the output terminal 12, namely, a gate-source voltage of the PMOS transistor 15, increases in proportion to the input current Iin. However, while the PMOS transistor 15 remains to be in an off-state, the input current Iin entirely flows into the feedback resistor 14. At this point, when a current flowing into the feedback resistor 14 is indicated as If, the input current Iin is equal to the current If. When the input current Iin injected by the photodiode 1 is so large that the voltage difference Vin–Vout exceeds the threshold voltage Vt of the PMOS transistor 15, the PMOS transistor 15 is turned on. As a result, a part of the input current Iin flows into the ground power supply Vss through the PMOS transistor 15. At this point, when the drain current of the PMOS transistor 15 is indicated as Id, Iin=If+Id. In other words, when the input current Iin is large, a part of the input current Iin is shunted by the PMOS transistor 15, resulting in decreasing the current If flowing into the feedback resistor 14 as compared with the case where the PMOS transistor 15 is not disposed. Accordingly, even when the feedback resistance value Rf is set at a large value so as to attain the high sensitivity, the output voltage Vout can be suppressed from excessively decreasing. Thus, the wide dynamic range characteristic can be attained while suppressing the occurrence of ringing.

Figure 2:
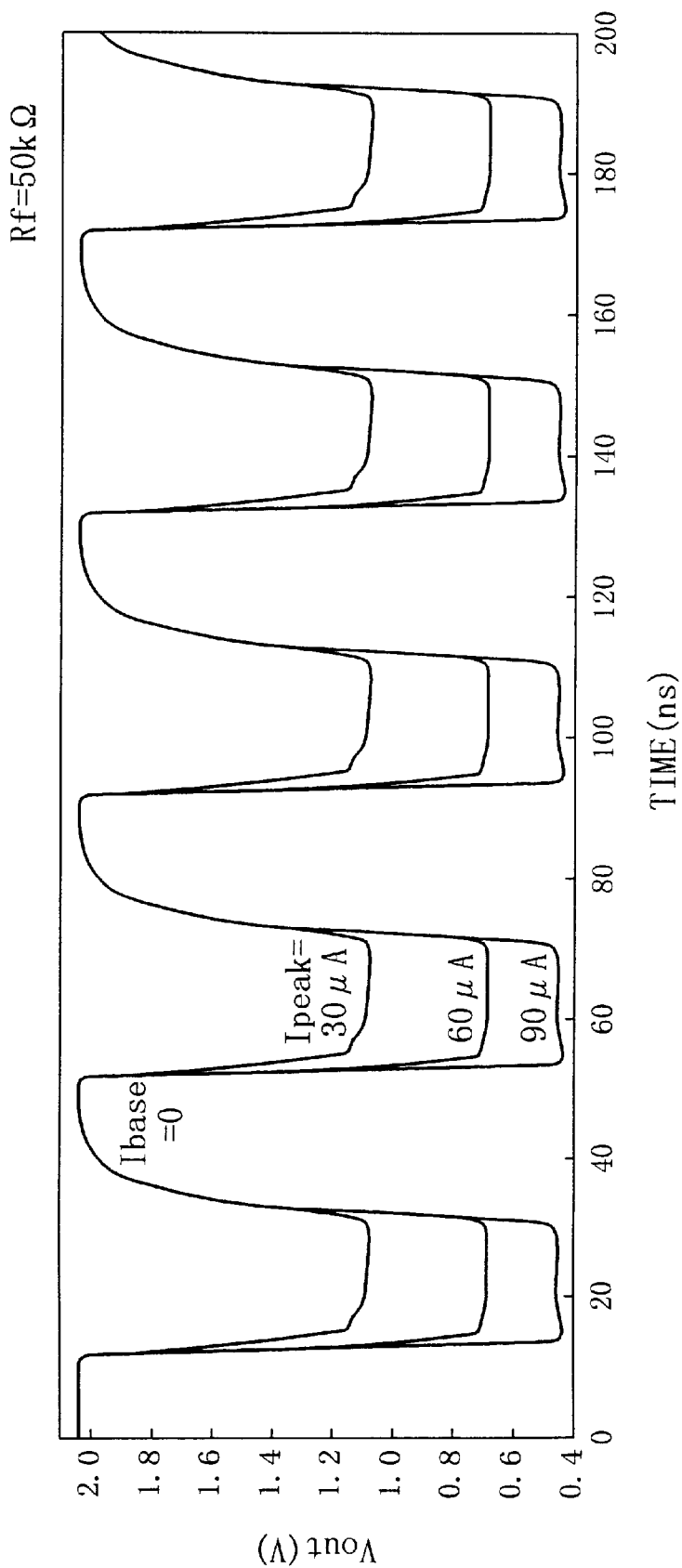
FIG. 2 is an output voltage waveform diagram of the pre-amplifier of FIG. 1.

FIG. 2 is a waveform diagram of the output voltage Vout obtained through simulation of the pre-amplifier 10 of FIG. 1. The peak values of the input current Iin, namely, the values of the peak current Ipeak are 30 µA, 60 µA and 90 µA. The feedback resistance value Rf is set at 50 kΩ. As is shown in FIG. 2, the output voltage waveform is not largely distorted at any peak current Ipeak, and a good waveform is obtained. It is noted that the feedback resistance value Rf is required to be set at 40 kΩ or more in order to improve the sensitivity of the optical receiver with the thermal noise derived from the feedback resistor 14 decreased.

Figure 3:
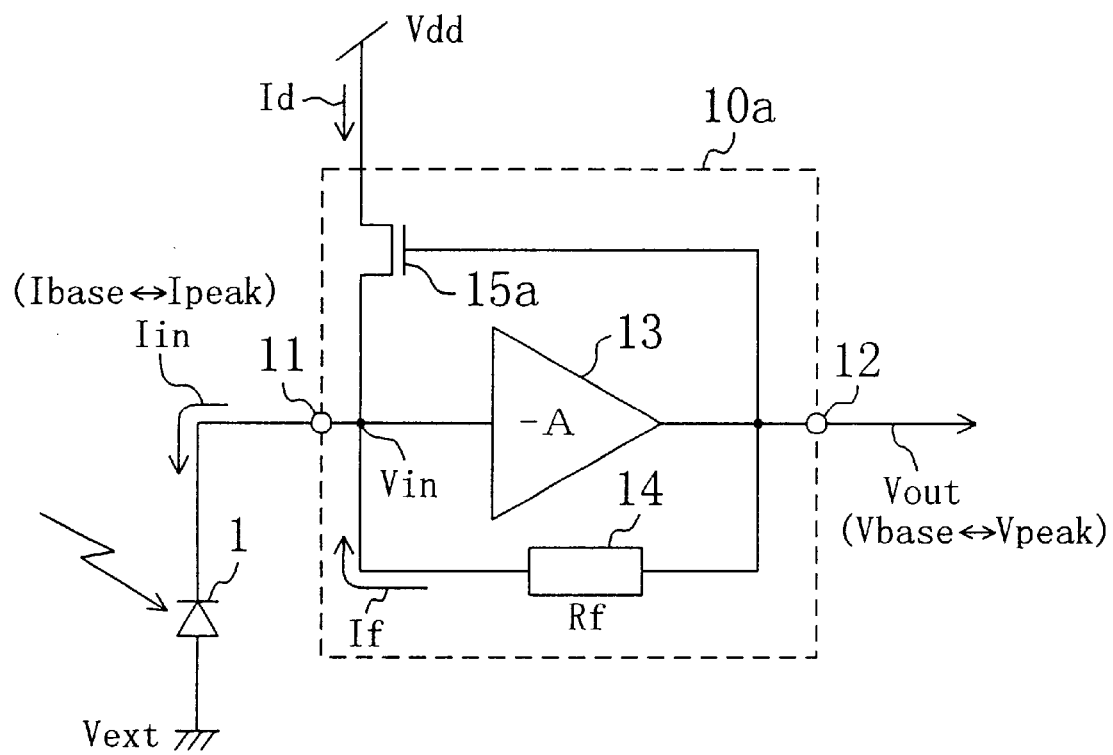
FIG. 3 is an electric circuit diagram for showing another exemplified configuration of the pre-amplifier of the invention.

FIG. 3 shows another exemplified configuration of the pre-amplifier of the invention. In FIG. 3, a reference numeral 1 denotes a photodiode and a reference numeral 10a denotes the pre-amplifier. The pre-amplifier 10a converts an input current Iin supplied by the photodiode 1 so as to swing between a base current Ibase and a peak current Ipeak into an output voltage Vout swinging between a base voltage Vbase corresponding to the base current Ibase and a peak voltage Vpeak corresponding to the peak current Ipeak. The pre-amplifier 10a includes an input terminal 11 for inputting the input current Iin, an output terminal 12 for outputting the output voltage Vout, an inverting amplification circuit 13 and a feedback resistor 14 connected in parallel with each other between the input terminal 11 and the output terminal 12, and a shunt transistor 15a connected between the input terminal 11 and a positive power supply Vdd. The photodiode 1 is a light receiving device for generating a current signal in accordance with an optical signal transferred through an optical fiber, and is disposed so that the input current Iin can be extracted from the input terminal 11 to an external power supply Vext. The inverting amplification circuit 13 has a gain A, and is connected between a positive power supply Vdd and a ground power supply Vss not shown. The feedback resistor 14 has a resistance value Rf. In the configuration of FIG. 3, an NMOS (n-channel type metal oxide semiconductor) transistor is used as the shunt transistor 15a. The source of the NMOS transistor 15a is connected with the input terminal 11, the gate thereof is connected with the output terminal 12 and the drain thereof is connected with the positive power supply Vdd.

Herein, a voltage of the input terminal 11 is indicated as Vin. Since the input terminal 11 and the output terminal 12 are connected with each other through the feedback resistor 14, when Iin=Ibase=0, Vin=Vout=Vbase. At this point, the NMOS transistor 15a is in an off-state. The photodiode 1 extracts the input current Iin with a given amplitude from the input terminal 11. Accordingly, the output voltage Vout swings to be higher than the base voltage Vbase. In other words, the output voltage Vout swings between the base voltage (minimum voltage) Vbase and the peak voltage (maximum voltage) Vpeak. This peak voltage Vpeak increases in proportion to the peak current Ipeak. On the other hand, the voltage Vin remains to be substantially constant to be equal to the base voltage Vbase because the gain A of the inverting amplification circuit 13 is very large. Accordingly, a voltage difference Vout–Vin between the input terminal 11 and the output terminal 12, namely, a gate-source voltage of the NMOS transistor 15a, increases in proportion to the input current Iin. However, while the NMOS transistor 15a remians to be in an off-state, the input current Iin entirely flows from the feedback resistor 14. At this point, when a current flowing from the feedback resistor 14 is indicated as If, the input current Iin is equal to the current If. When the input current Iin extracted by the photodiode 1 is so large that the voltage difference Vout–Vin exceeds the threshold voltage Vt of the NMOS transistor 15a, the NMOS transistor 15a is turned on. As a result, a part of the input current Iin flows from the positive power supply Vdd through the NMOS transistor 15a. At this point, when the drain current of the NMOS transistor 15a is indicated as Id, Iin=If +Id. In other words, when the input current Iin is large, a part of the input current Iin is shunted by the NMOS transistor 15a, resulting in decreasing the current If flowing from the feedback resistor 14 as compared with the case where the NMOS transistor 15a is not disposed. Accordingly, even when the feedback resistrance value Rf is set at a large value so as to attain the high sensitivity, the output voltage Vout can be suppressed from excessively increasing. Thus, the wide dynamic range characteristic can be attained while suppressing the occurrence of ringing. Modification from the configuration of FIG. 1 to that of FIG. 3 can be similarly made also in configurations described below.

Figure 4:
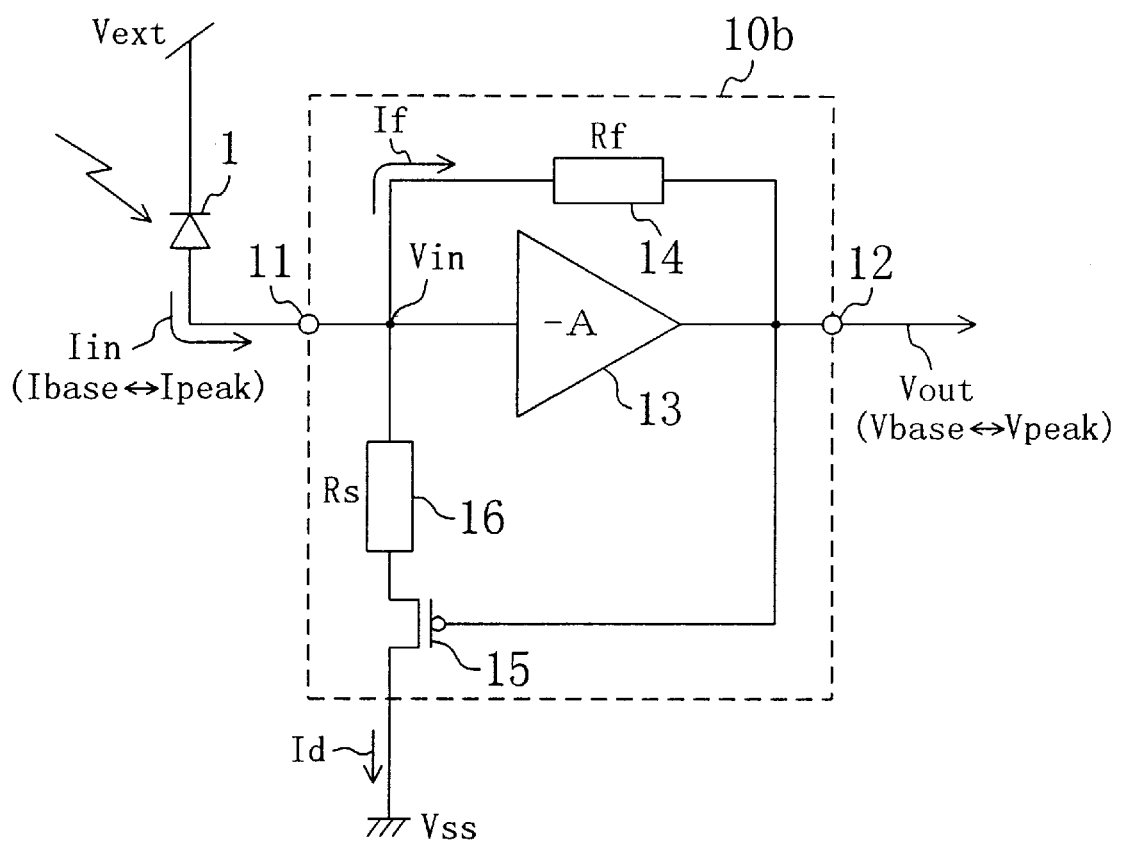
FIG. 4 is an electric circuit diagram for showing still another exemplified configuration of the pre-amplifier of the invention.

FIG. 4 shows still another exemplified configuration of the pre-amplifier of the invention. The pre-amplifier lob of FIG. 4 includes a serial resistor (Rs) 16 interposed between the input terminal 11 and the source of the PMOS transistor 15 of FIG. 1. In the configuration of FIG. 4, voltage decrease in proportion to the drain current Id of the PMOS transistor 15 is caused between the ends of the serial resistor 16, and hence, the gate-source voltage of the PMOS transistor 15 can be prevented from rapidly increasing. Accordingly, even when the output voltage Vout is to rapidly vary, the output voltage waveform can be prevented from being distorted through excessive current extraction of the PMOS transistor 15.

Figure 5:
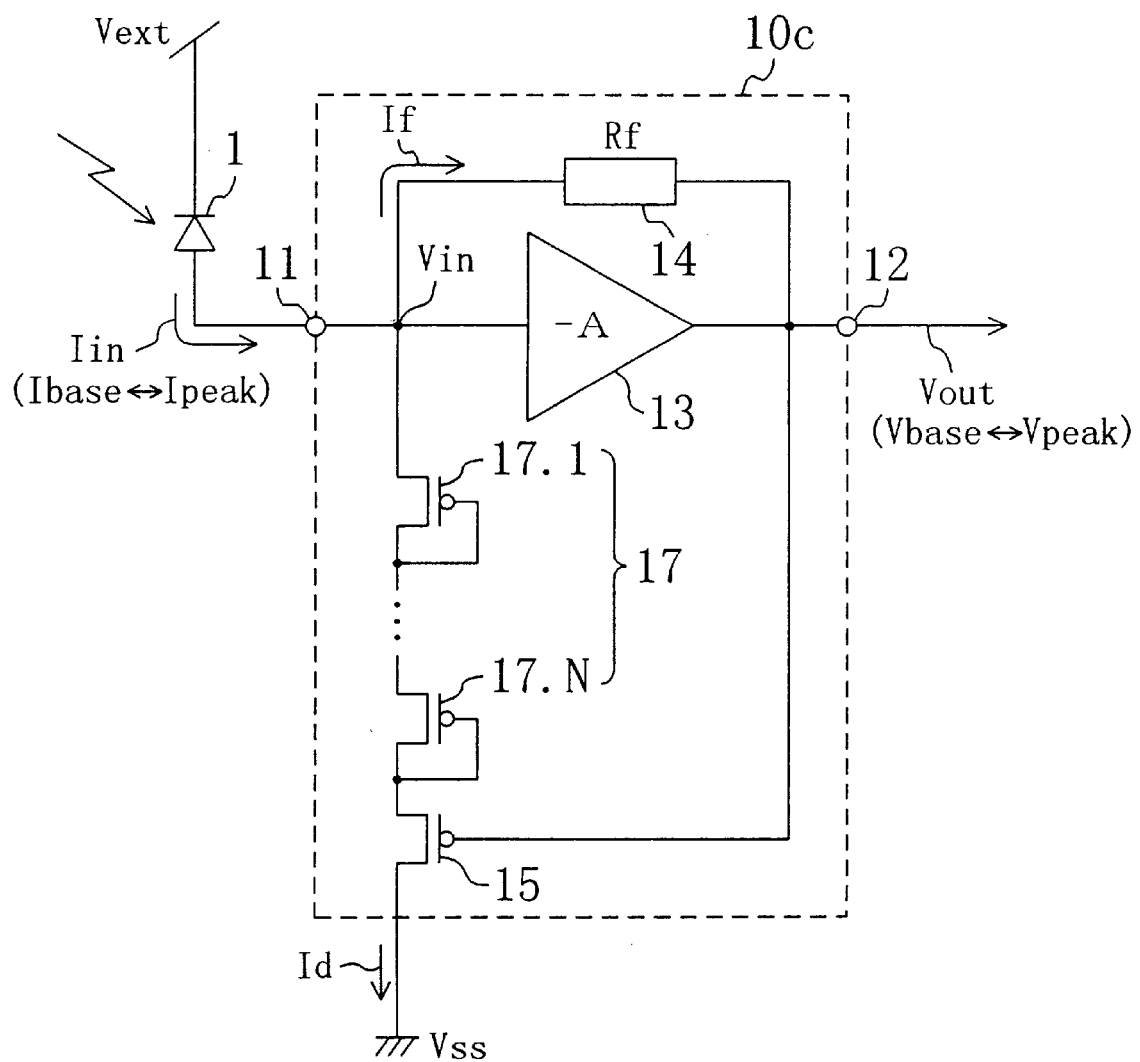
FIG. 5 is an electric circuit diagram for showing still another exemplified configuration of the pre-amplifier of the invention.

FIG. 5 shows still another exemplified configuration of the pre-amplifier of the invention. The pre-amplifier 10c of FIG. 5 includes a serial circuit 17 interposed between the input terminal 11 and the source of the PMOS transistor 15 of FIG. 1. The serial circuit 17 includes serial connection of N PMOS transistors 17.1 through 17.N which are diode-connected with one another (namely, whose drains and gates are connected with each other). When the threshold voltage of each of the N PMOS transistors 17.1 through 17.N is indicated as Vt similarly to that of the PMOS transistor 15 working as the shunt transistor, the output voltage Vout has a value equal to Vin–(N +1)Vt when the PMOS transistor 15 is turned on. In this manner, the output voltage amplitude can be easily controlled by adopting the configuration of FIG. 5.

Figure 6:
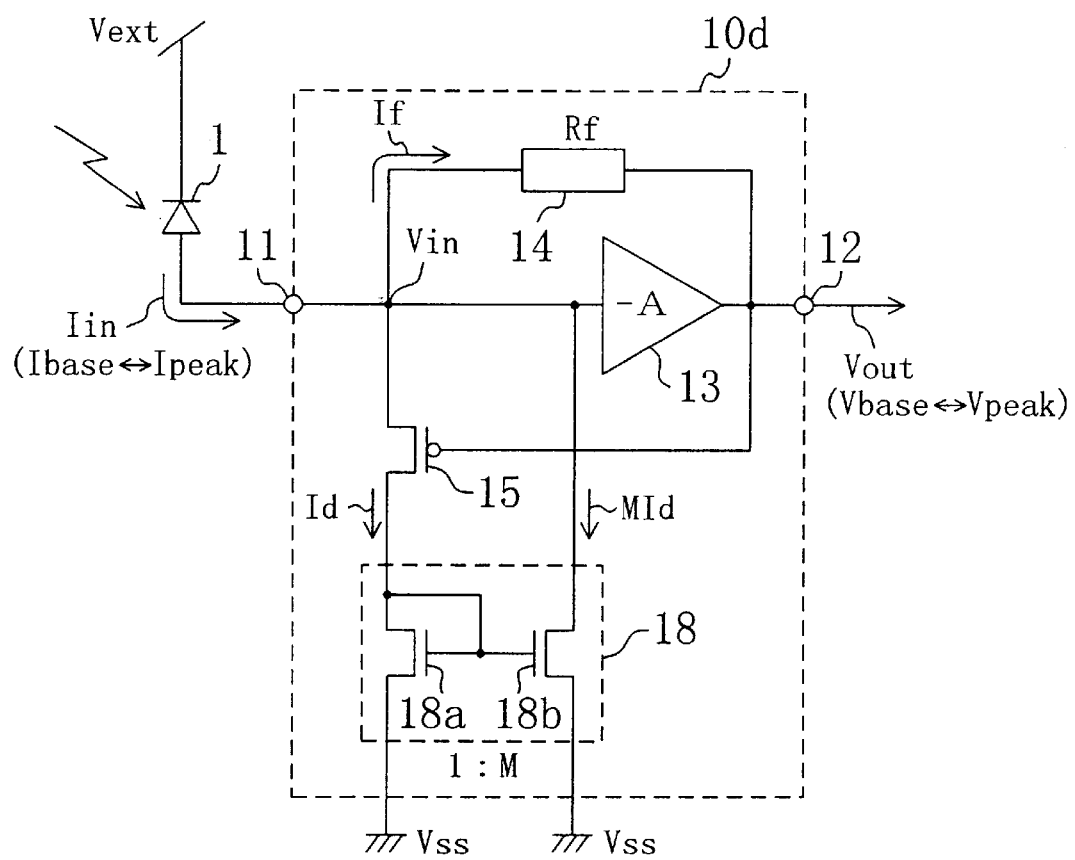
FIG. 6 is an electric circuit diagram for showing still another exemplified configuration of the pre-amplifier of the invention.

FIG. 6 shows still another exemplified configuration of the pre-amplifier of the invention. The pre-amplifier 10d of FIG. 6 includes, in addition to the composing elements of the pre-amplifier 10 of FIG. 1, a current mirror circuit 18 having a mirror ratio M for further shunting, from the input current Iin, a current M times as large as the current Id shunted by the PMOS transistor 15. The current mirror circuit 18 includes first and second NMOS transistors 18a and 18b. The drain and the gate of the first NMOS transistor 18a are connected with the drain of the PMOS transistor 15. The gates of the first and second NMOS transistors 18a and 18b are connected with each other. The drain of the second NMOS transistor 18b is connected with the input terminal 11. The sources of the NMOS transistors 18a and 18b are connected with ground power supplies Vss. In the configuration of FIG. 6, a current with an amplitude of (M+1) Id can be shunted from the input terminal 11. In addition, when the size of the second NMOS transistor 18b is designed to be small, the input capacitance Cin of the pre-amplifier can be suppressed from increasing. Accordingly, the frequency characteristic and the noise characteristic can be prevented from degrading (See the aforementioned formula (4)).

Figure 7:
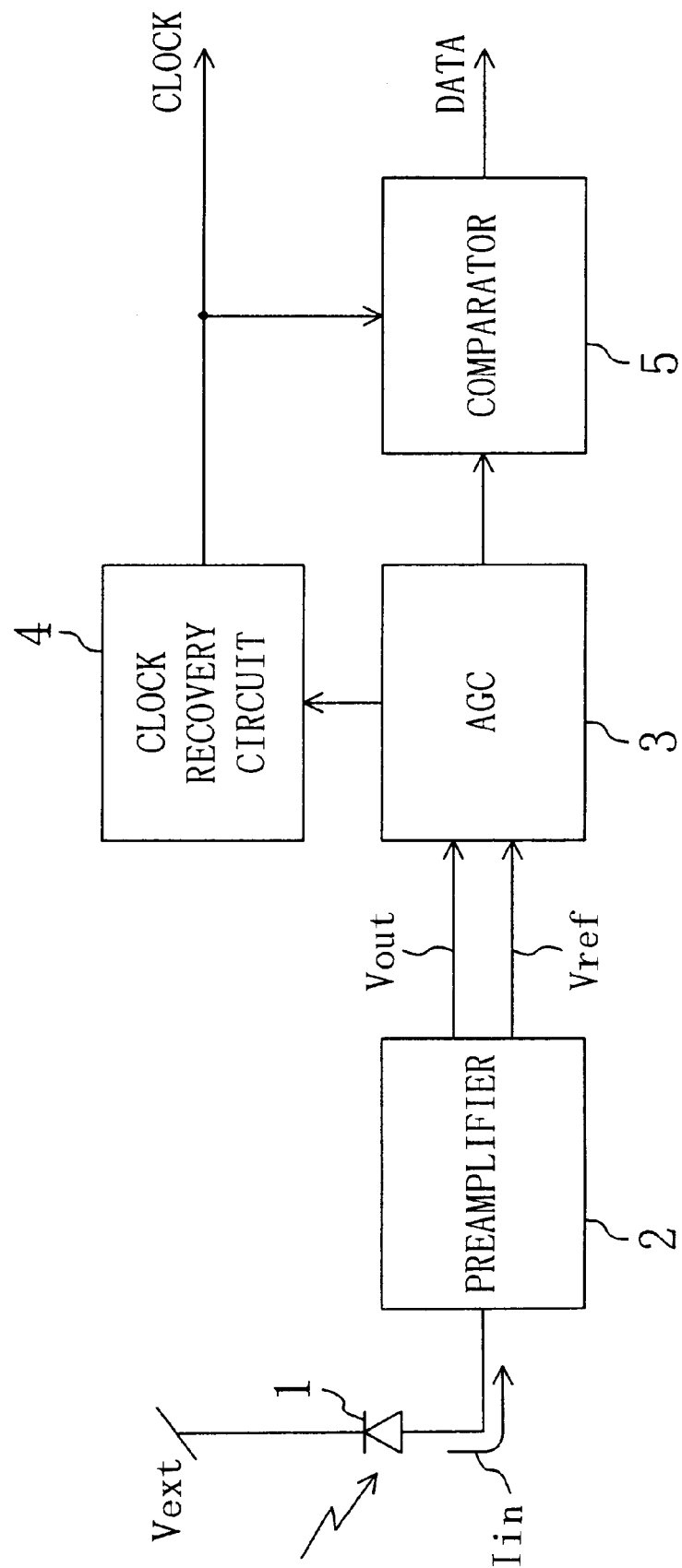
FIG. 7 is a block diagram for showing an exemplified configuration of an optical receiver using the pre-amplifier of the invention.

FIG. 7 shows an exemplified configuration of an optical receiver using the pre-amplifier of the invention. The optical receiver of FIG. 7 includes a photodiode 1 for generating a current signal Iin in accordance with an optical signal supplied through an optical fiber, a pre-amplifier 2 for converting the current signal Iin into a voltage signal Vout and generating a reference voltage signal Vref for the voltage signal Vout, an AGC circuit 3 for converting the voltage signal Vout into a voltage signal with a given amplitude by using the reference voltage signal Vref, a clock recovery circuit 4 for recovering a clock signal from the output of the AGC circuit 3, and a comparator 5 for reproducing digital data from the output of the AGC circuit 3 in synchronization with the clock signal. All the elements shown in FIG. 7 excluding the photodiode 1 are mounted in one-chip IC (integrated circuit), and the IC is connected with a positive power supply Vdd and a ground power supply Vss not shown. The photodiode 1 is connected with an external power supply Vext.

Figure 8:
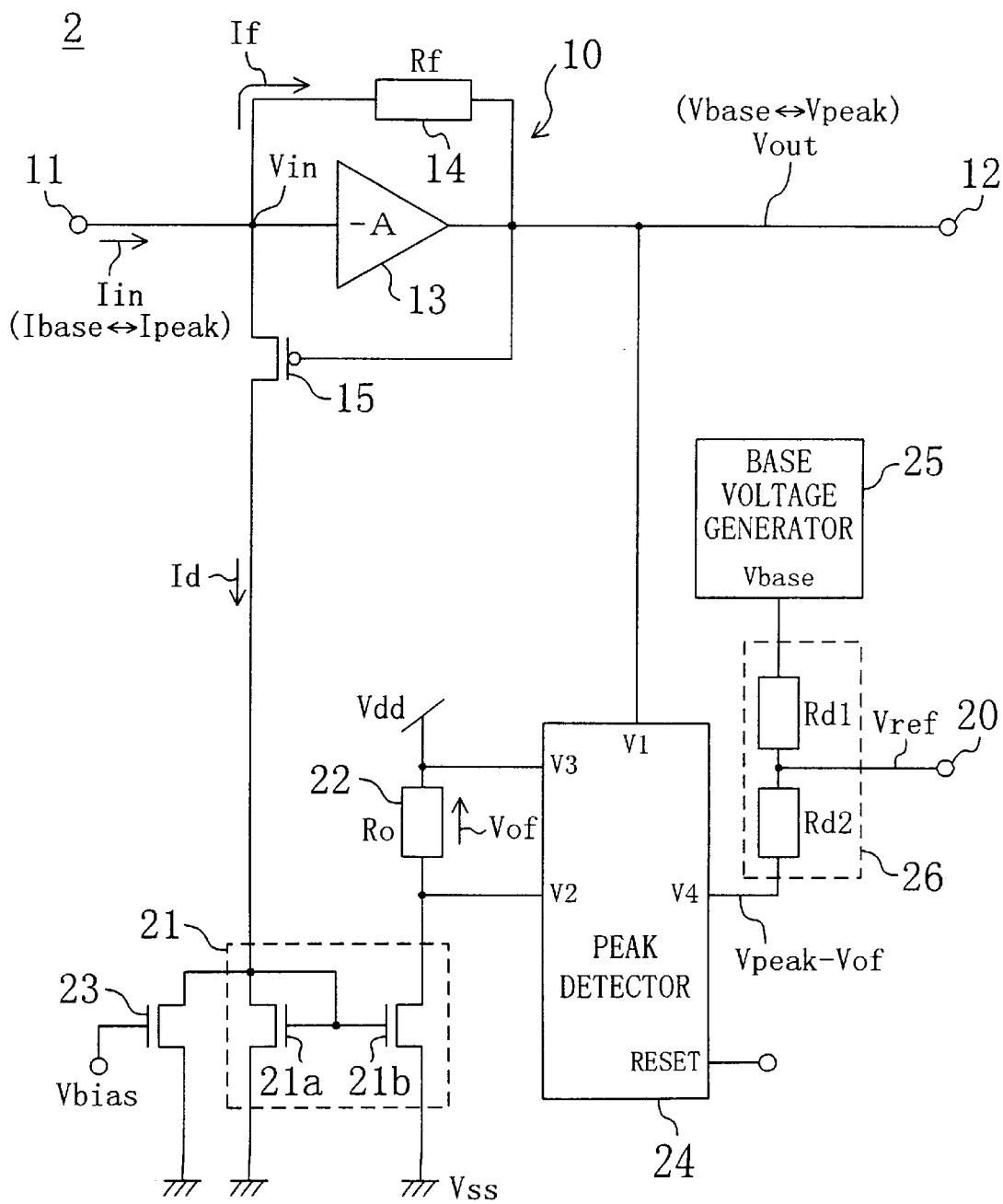
FIG. 8 is a block diagram for showing the inside configuration of the pre-amplifier of FIG. 7.

FIG. 8 shows the inside configuration of the pre-amplifier 2 of FIG. 7. The pre-amplifier 2 of FIG. 8 includes, in addition to the composing elements of the pre-amplifier 10 of FIG. 1 for converting the input current Iin swinging between the base current Ibase and the peak current Ipeak into the output voltage Vout swinging between the base voltage Vbase corresponding to the base current Ibase and the peak voltage Vpeak corresponding to the peak current Ipeak, a reference terminal 20 for outputting the reference voltage Vref, a current mirror circuit 21 composed of first and second NMOS transistors 21a and 21b for generating a current in proportion to the current Id shunted by the PMOS transistor 15, a resistor (RO) 22 for converting the current generated by the current mirror circuit 21 into an offset voltage Vof, a third NMOS transistor 23 for reversely biasing the input terminal of the current mirror circuit 21, a peak detector 24 for detecting the peak value Vpeak of the output voltage Vout and generating a corrected peak voltage Vpeak−Vof by correcting the peak value Vpeak by using the offset voltage Vof, a base voltage generator 25 for generating a voltage equal to the base voltage Vbase, and a voltage divider 26 for generating an average voltage of the corrected peak voltage Vpeak−Vof and the base voltage Vbase as the reference voltage Vref.

The configuration of FIG. 8 will now be described in detail. The drain and the gate of the first NMOS transistor 21a and the drain of the third NMOS transistor 23 are connected with the drain of the PMOS transistor 15. The gates of the first and second NMOS transistors 21a and 21b are connected with each other. The drain of the second NMOS transistor 21b is connected with the positive power supply Vdd through the resistor 22. The sources of the first, second and third NMOS transistors 21a, 21b and 23 are connected with the ground power supplies Vss. The gate of the third NMOS transistor 23 is supplied with a bias voltage Vbias so that the output current of the current mirror circuit 21 can be completely cut off when the PMOS transistor 15 is in an off-state. The peak detector 24 has five main terminals V1, V2, V3, V4 and RESET. The terminal V1 is supplied with the output voltage Vout swinging between the base voltage Vbase and the peak voltage Vpeak. Between the terminals V2 and V3, the offset voltage Vof is applied. The terminal V4 is used for supplying the corrected peak voltage Vpeak−Vof to the voltage divider 26. The voltage divider 26 includes serial connection of two resistors Rd1 and Rd2 having the same resistance value. Accordingly, the following relationship holds:

Vref={Vbase+(Vpeak−Vof)}/2

=(Vbase+Vpeak)/2−Vof/2 (9)

Figure 9:
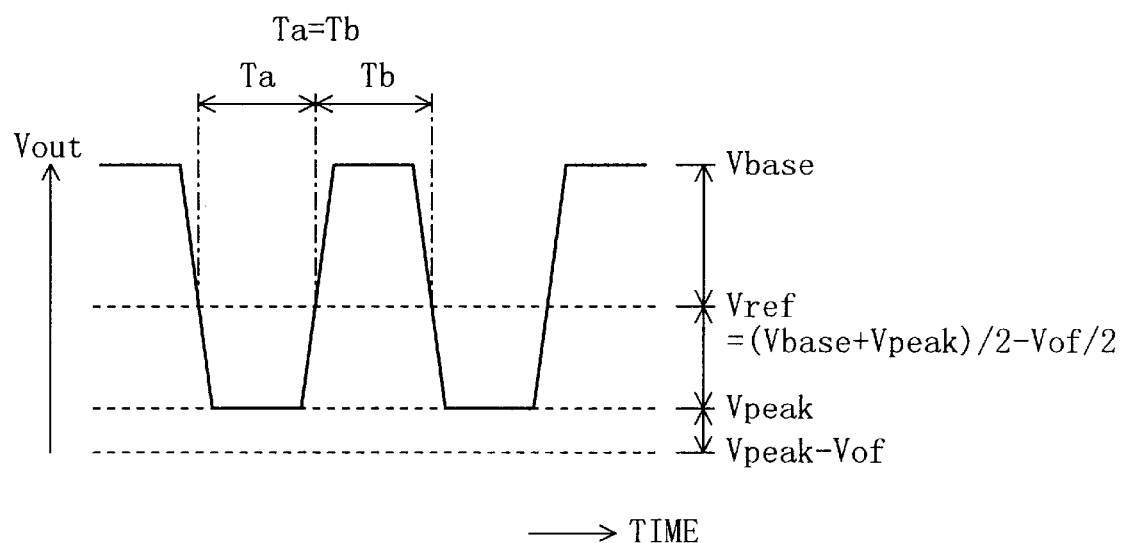
FIG. 9 is a voltage waveform diagram for showing the principle of generation of a reference voltage in the configuration shown in FIG. 8.

FIG. 9 shows the principle of generation of the reference voltage Vref represented by the formula (9) in adopting the configuration of FIG. 8. When the following formula is assumed to be used as a reference voltage generation formula:

Vref'=(Vbase+Vpeak)/2 (10)

an input duty factor to the AGC circuit 3 is degraded by deviation of the output voltage amplitude due to the shunt by the PMOS transistor 15, and hence, malfunction of the clock recovery circuit 4 can be caused. However, when the formula (9) is used as the reference voltage generation formula, the reference voltage Vref is lowered by a voltage Vof /2 than the mean voltage Vref' of the output voltage amplitude in accordance with the current Id flowing in the PMOS transistor 15. Therefore, Ta can be equal to Tb as is shown in FIG. 9, and thus, the duty factor can be improved. At this point, Ta indicates a period when the output voltage Vout is at a low level and Tb indicates a period when the output voltage Vout is at a high level.

Figure 10:
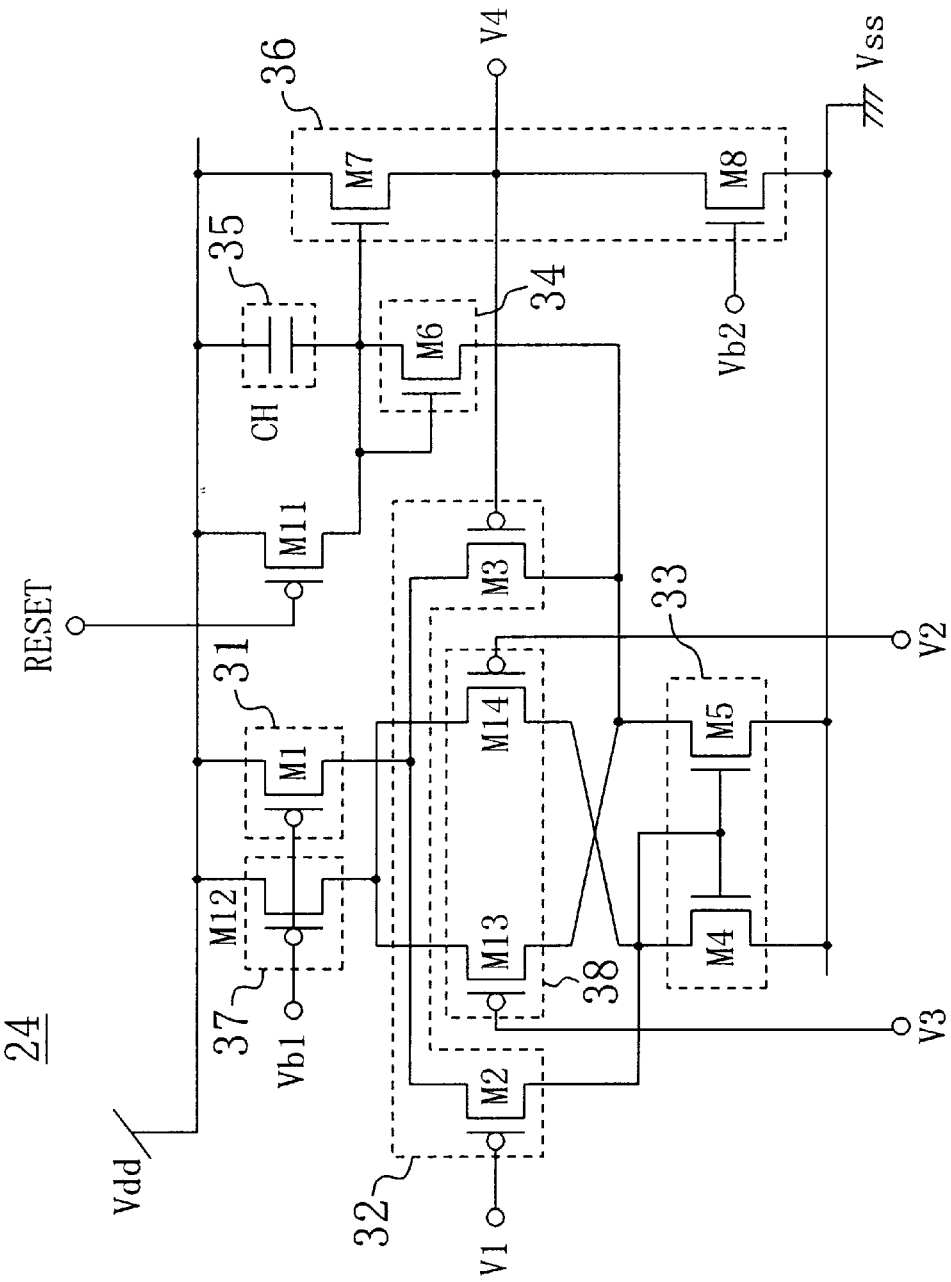
FIG. 10 is an electric circuit diagram for showing an exemplified inside configuration of a peak detector of FIG. 8.

FIG. 10 shows an exemplified inside configuration of the peak detector 24 of FIG. 8. In FIG. 10, a reference numeral 31 denotes a first current source of a PMOS transistor M1 whose gate is supplied with a constant voltage Vb1, a reference numeral 32 denotes a first differential transistor pair including two PMOS transistors M2 and M3 whose sources are connected with each other, a reference numeral 33 denotes a current mirror circuit including a diode-connected NMOS transistor M4 and an NMOS transistor M5, a reference numeral 34 denotes a unilateral conductive device of a diode-connected NMOS transistor M6, a reference numeral 35 denotes a holding capacitor (CH), a reference numeral 36 denotes a source follower or a buffer circuit including two NMOS transistors M7 and M8, a reference numeral 37 denotes a second current source of a PMOS transistor M12 whose gate is supplied with the constant voltage Vb1, and a reference numeral 38 denots a second differential transistor pair including two PMOS transistors M13 and M14 whose sources are connected with each other.

The configuration of FIG. 10 will now be described in detail. The PMOS transistor M1 is connected between a positive power supply Vdd and the sources of the PMOS transistors M2 and M3 so as to bias the first differential transistor pair 32. The drain of the PMOS transistor M2 is connected with the drain and the gate of the NMOS transistor M4, and the drain of the PMOS transistor M3 is connected with the drain of the NMOS transistor M5. The drain and the gate of the NMOS transistor M4 are connected with the gate of the NMOS transistor M5. The sources of the NMOS transistors M4 and M5 are connected with a ground power supply Vss. The drain of the NMOS transistor M5 is connected with the source of the NMOS transistor M6. The drain and the gate of the NMOS transistor M6 are connected with the positive power supply Vdd through the holding capacitor 35, also connected with the positive power supply Vdd through the PMOS transistor M11 whose gate is connected with the terminal RESET, and also connected with the gate of the NMOS transistor M7. The terminal RESET is supplied with a signal for discharging a peak charge held by the holding capacitor 35. The drain of the NMOS transistor M7 is connected with the positive power supply Vdd. The source of the NMOS transistor M7 is connected with the terminal V4 and with the ground power supply Vss through the NMOS transistor M8 whose gate is supplied with a constant voltage Vb2. The source voltage of the NMOS transistor M7 is fed back to the gate of the PMOS transistor M3. The PMOS transistor M12 is connected between the positive power supply Vdd and the sources of the PMOS transistors M13 and M14, so as to bias the second differential transistor pair 38. The drain of the PMOS transistor M13 is connected with the drain of the NMOS transistor M5, and the drain of the PMOS transistor M14 is connected with the drain and the gate of the NMOS transistor M4. The gates of the three PMOS transistors M2, M13 and M14 are connected with the terminals V1, V3 and V2, respectively.

In the peak detector 24 of FIG. 10, the output voltage Vout swinging between the base voltage Vbase and the peak voltage Vpeak is supplied to the terminal V1. Between the terminals V2 and V3, the offset voltage Vof is supplied. Accordingly, the second differential transistor pair 38 allows a current in accordance with the offset voltage Vof to flow into the current mirror circuit 33 in a phase reverse to that of the first differential transistor pair 32. Ultimately, a voltage corresponding to canceling the thus flowing current is extracted from the peak voltage Vpeak, and the corrected peak voltage Vpeak−Vof thus obtained is output from the terminal V4.

In the above-described exemplified configurations, the MOS transistors are used so as to decrease a cost of the optical receiver. When the MOS process is adopted, a resistor and a capacitance can be easily formed. However, the invention is not limited to the MOS process but can be applied to any type of semiconductor process.

what is claimed is:

1. A pre-amplifier for use in an optical digital receiver for converting an input current, supplied by a light receiving device so as to swing between a base current and a peak current, into an output voltage swinging between a base voltage corresponding to said base current and a peak voltage corresponding to said peak current, comprising:

an input terminal for inputting said input current;

an output terminal for outputting said output voltage;

an inverting amplification circuit connected between said input terminal and said output terminal;

a feedback resistor connected between said input terminal and said output terminal; and a shunt transistor connected with said input terminal at a source thereof, with said output terminal at a gate thereof and with a power supply at a drain thereof;

wherein, when said input current is so large that a voltage difference between said input terminal and said output terminal exceeds a threshold value, which is a gate-source voltage of said shunt transistor, said shunt transistor is turned on and shunts AC and DC components of an excess current therethrough bit by bit, thereby decreasing a current flowing to said feedback resistor.

2. The pre-amplifier for use in an optical receiver of claim 1, wherein said shunt transistor is a metal oxide semiconductor transistor.

3. The pre-amplifier for use in an optical receiver of claim 1, further comprising a resistor connected between said input terminal and the source of said shunt transistor.

4. The pre-amplifier for use in an optical receiver of claim 1, further comprising a serial circuit connected between said input terminal and the source of said shunt transistor, said serial circuit including serial connection of plural transistors whose drains and gates are connected with each other.

5. The pre-amplifier for use in an optical receiver of claim 1, further comprising a current mirror circuit for further shunting, from said input current, a current several times as large as the current shunted by said shunt transistor.

6. The pre-amplifier for use in an optical receiver of claim 1, further comprising:

means for generating an average voltage of said base voltage and a corrected peak voltage obtained by correcting said peak voltage by using an offset voltage in proportion to the current shunted by said shunt transistor; and a reference terminal for outputting said generated average voltage as a reference voltage for said output voltage.

7. The pre-amplifier for use in an optical receiver of claim 6, wherein said means for generating said average voltage includes:

converting means for converting the current shunted by said shunt transistor into said offset voltage;

a peak detector for detecting a peak value of said output voltage and generating said corrected peak voltage by correcting said peak value by using said offset voltage supplied by said converting means;

a base voltage generator for generating a voltage equal to said base voltage; and a voltage divider for generating an average voltage of said corrected peak voltage generated by said peak detector and said voltage generated by said base voltage generator.

8. The pre-amplifier for use in an optical receiver of claim 7, wherein said converting means includes:

a current mirror circuit for generating a current in proportion to the current shunted by said shunt transistor; and a resistor for converting said current generated by said current mirror circuit into said offset voltage.

9. The pre-amplifier for use in an optical receiver of claim 8, further comprising a transistor for reversely biasing an input terminal of said current mirror circuit so as to completely cut off an output current of said current mirror circuit when said shunt transistor is in an off-state.

* * * * *